US012772865B2

(12) United States Patent
Agarwal et al.

(10) Patent No.: US 12,772,865 B2
(45) Date of Patent: Oct. 20, 2026

(54) MULTI-LEVEL BRIDGE INTERCONNECTS

(71) Applicant: ADVANCED MICRO DEVICES, INC., Santa Clara, CA (US)

(72) Inventors: Rahul Agarwal, Santa Clara, CA (US); Raja Swaminathan, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 53 days.

(21) Appl. No.: 17/134,601

(22) Filed: Dec. 28, 2020

(65) Prior Publication Data

US 2022/0208712 A1 Jun. 30, 2022

(51) Int. Cl.

*H10W 70/05* (2026.01)
*H10W 70/60* (2026.01)
*H10W 70/652* (2026.01)
*H10W 90/00* (2026.01)

(52) U.S. Cl.

CPC ......... *H10W 70/093* (2026.01); *H10W 90/00* (2026.01); *H10W 70/60* (2026.01); *H10W 70/6528* (2026.01)

(58) Field of Classification Search

CPC ..... H01L 25/0652; H01L 24/82; H01L 24/20; H01L 2224/2101-214

See application file for complete search history.

(56) References Cited

U.S. PATENT DOCUMENTS

| | | | | |
|---|---|---|---|---|
| 9,059,127 | B1 * | 6/2015 | Lamorey | H01L 23/5286 |
| 9,812,429 | B2 * | 11/2017 | Das | H01L 23/5226 |
| 9,972,611 | B2 * | 5/2018 | Pappu | G11C 5/025 |
| 10,943,844 | B2 * | 3/2021 | Tsukiyama | H10W 70/611 |
| 2011/0089573 | A1 * | 4/2011 | Kurita | H01L 25/18<br>438/106 |
| 2014/0246781 | A1 * | 9/2014 | Hosomi | H10W 90/00<br>257/774 |
| 2016/0056102 | A1 * | 2/2016 | Konchady | H01L 23/5383<br>174/263 |
| 2018/0040592 | A1 * | 2/2018 | Gandhi | H01L 24/13 |
| 2018/0076187 | A1 * | 3/2018 | Karakane | H10P 72/7402 |
| 2019/0371778 | A1 * | 12/2019 | Sankman | H01L 21/563 |
| 2021/0098381 | A1 * | 4/2021 | Yu | H01L 25/0652 |
| 2021/0125967 | A1 * | 4/2021 | Zhai | H01L 25/105 |
| 2021/0343547 | A1 * | 11/2021 | Chang | H01L 23/147 |
| 2022/0157803 | A1 * | 5/2022 | Sankman | H01L 24/96 |
| 2022/0359430 | A1 * | 11/2022 | Tsai | H01L 21/563 |
| 2022/0384212 | A1 * | 12/2022 | Chang | H01L 23/49827 |

* cited by examiner

*Primary Examiner* — Khaja Ahmad

(57) ABSTRACT

A method of manufacturing a semiconductor device, including: bonding a first chip layer comprising a first semiconductor chip to a second chip layer comprising a second semiconductor chip to electrically couple an interconnect of the first semiconductor chip to a first interconnect of the second semiconductor chip; and bonding a third chip layer comprising a third semiconductor chip to the second chip layer to electrically couple an interconnect of the third semiconductor chip to a second interconnect of the second semiconductor chip.

20 Claims, 9 Drawing Sheets

MULTI-LEVEL BRIDGE INTERCONNECTS

BACKGROUND

Semiconductor device including multi-chip modules (MCM) combine multiple discrete semiconductor components on a semiconductor device substrate. A MCM can combine multiple individual integrated circuits (IC), or semiconductor chips, to form a large integrated circuit. The discrete semiconductor components often communicate with one another using interconnect chips to connect various input/output regions of adjacent semiconductor chips. Bandwidth requirements between discrete semiconductor components increase as the components become more powerful.

DETAILED DESCRIPTION

Figure 1:
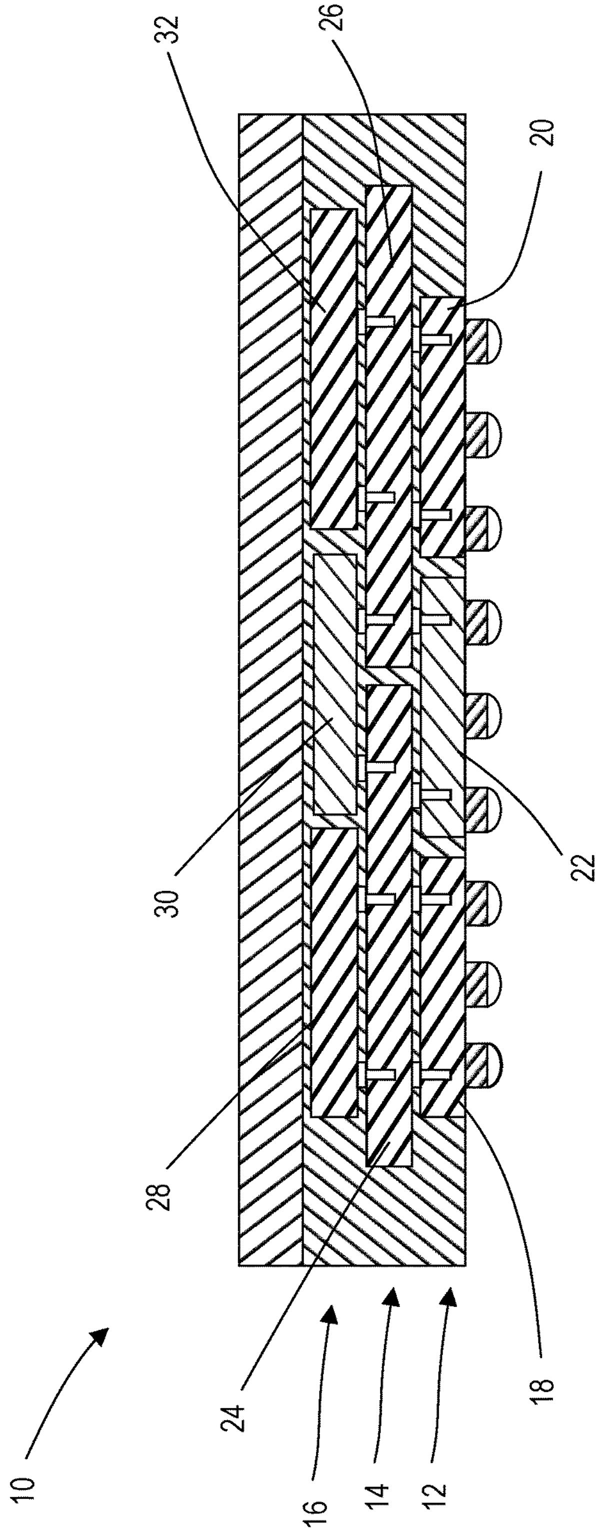
FIG. 1 is a cross-sectional view of an example semiconductor device according to some embodiments.

In some embodiments, a method of manufacturing a semiconductor device, includes: bonding a first chip layer including a first semiconductor chip to a second chip layer including a second semiconductor chip to electrically couple an interconnect of the first semiconductor chip to a first interconnect of the second semiconductor chip; and bonding a third chip layer including a third semiconductor chip to the second chip layer to electrically couple an interconnect of the third semiconductor chip to a second interconnect of the second semiconductor chip.

In some embodiments at least one interconnect of the first, second, or third semiconductor chips includes a through silicon via electrically coupling a back side of a respective semiconductor chip to an interconnect portion of the respective semiconductor chip.

In some embodiments, the first chip layer further includes an interconnect chip adjacent the first semiconductor chip and the second chip layer includes a fourth semiconductor chip, and bonding the first chip layer to the second chip layer electrically couples a first interconnect of the interconnect chip to a third interconnect of the second semiconductor chip and a second interconnect of the interconnect chip to a first interconnect of the fourth semiconductor chip.

In some embodiments, the third chip layer further includes a second interconnect chip adjacent the third semiconductor chip, and bonding the third chip layer to the second chip layer electrically couples a first interconnect of the second interconnect chip to a fourth interconnect of the second semiconductor chip and a second interconnect of the second interconnect chip to a second interconnect of the second semiconductor chip.

In some embodiments the first, second, and third chip layers are arranged such that a back side of the first semiconductor chip faces a front side of the second semiconductor chip, and a back side of the second semiconductor chip face a front side of the third semiconductor chip.

In some embodiments, the first, second, and third chip layers are arranged such that a front side of the first semiconductor chip faces a front side of the second semiconductor chip, and a back side of the second semiconductor chip faces a front side of the first semiconductor chip.

In some embodiments, the method further includes electrically coupling the interconnect of the first semiconductor chip and the first interconnect of the second semiconductor chip by way of a redistribution layer.

In some embodiments, a semiconductor device includes: a first chip layer including a first semiconductor chip having a plurality of interconnects; a second chip layer including a second semiconductor chip having a plurality of interconnects, wherein a first interconnect of the first semiconductor chip is electrically coupled to a first interconnect of the second semiconductor chip; and a third chip layer including a third semiconductor chip having a plurality of interconnects, wherein a first interconnect of the third semiconductor chip is electrically coupled to a second interconnect of the second semiconductor chip.

In some embodiments, at least one interconnect of the first, second, or third semiconductor chips includes a through silicon via electrically coupling a back side of a respective semiconductor chip to an interconnect portion of the respective semiconductor chip.

In some embodiments, the first chip layer further includes an interconnect chip having a plurality of interconnects, the second chip layer further includes a fourth semiconductor chip having a plurality of interconnects, and a first interconnect of the interconnect chip is electrically coupled to a third interconnect of the second semiconductor chip and a second interconnect of the interconnect chip is electrically coupled to a first interconnect of the fourth semiconductor chip.

In some embodiments, the third chip layer further includes a second interconnect chip having a plurality of interconnects and a first interconnect of the second interconnect chip is electrically coupled to a fourth interconnect of the second semiconductor chip and a second interconnect of the second interconnect chip is electrically coupled to a second interconnect of the fourth semiconductor chip.

In some embodiments, the first, second, and third chip layers are arranged such that a back side of the first semiconductor chip faces a front side of the second semiconductor chip, and a back side of the second semiconductor chip faces a front side of the third semiconductor chip.

In some embodiments, the first, second, and third chip layers are arranged such that a front side of the first semiconductor chip faces a front side of the second semiconductor chip, and a back side of the second semiconductor chip faces a front side of the first semiconductor chip.

In some embodiments, the semiconductor device further includes a redistribution layer electrically coupling the first interconnect of the first semiconductor chip and the first interconnect of the second semiconductor chip.

In some embodiments, a method of manufacturing a semiconductor device includes: mounting a first semiconductor chip, a second semiconductor chip, and a first interconnect chip together to form a first chip layer, wherein the first semiconductor chip, the second semiconductor chip, and the first interconnect chip each have a plurality of interconnects with at least one interconnect including a thru silicon via electrically coupling a backside of a respective semiconductor chip to an interconnect portion of the respective semiconductor chip; bonding a third semiconductor chip and a fourth semiconductor chip to the first chip layer to form a second chip layer, wherein the third semiconductor chip and the fourth semiconductor chip each have a plurality of interconnects with at least one interconnect including a thru silicon via electrically coupling a backside of a respective semiconductor chip to an interconnect portion of the respective semiconductor chip, and wherein a first interconnect of the first semiconductor chip is coupled to a first interconnect of the third semiconductor chip, a first interconnect of the first interconnect chip is electrically coupled to a second interconnect of the third semiconductor chip, a second interconnect of the first interconnect chip is electrically coupled to a first interconnect of the fourth semiconductor chip, and a first interconnect of the second semiconductor chip is electrically coupled to a second interconnect of the fourth semiconductor chip; and bonding a fifth semiconductor chip, a sixth semiconductor chip, and a second interconnect chip to the second layer to form a third layer, wherein the fifth semiconductor chip, the sixth semiconductor chip, and the second interconnect chip each have a plurality of interconnects, and wherein a third interconnect of the second semiconductor chip is coupled to a first interconnect of the fifth semiconductor chip, a fourth interconnect of the second semiconductor chip is electrically coupled to a first interconnect of the second interconnect chip, a third interconnect of the fourth semiconductor chip electrically coupled to a second interconnect of the second interconnect chip, and a fourth interconnect of the fourth semiconductor chip is electrically coupled to a first interconnect of the sixth semiconductor chip.

In some examples, the first layer is bonded to a carrier, and the method further includes bonding a support wafer to the third layer and removing the carrier.

In some examples, the method further includes filling gaps between the semiconductor chips with a gap fill material.

In some examples, the method further includes forming a plurality of through die vias providing access to the second layer.

In some examples, the method further includes bonding a back side of the first chip layer to a carrier and bonding a support wafer to the third chip layer.

In some examples, the method further includes including a redistribution layer between the first and second chip layers.

In the figures described below, reference numerals are generally repeated where identical elements appear in more than one figure. Various embodiments of the present disclosure are described in detail with reference to the figures, beginning with FIG. 1. FIG. 1 is a cross-sectional view of an exemplary semiconductor device 10 that can be mounted to another device such as a circuit board. The semiconductor device 10 includes a first chip layer 12, a second chip layer 14, and a third chip layer 16.

The first chip layer 12 has a first semiconductor chip 18, a first interconnect chip 20, and a second semiconductor chip 22. The second chip layer 14 includes a third semiconductor chip 24 and a fourth semiconductor chip 26. The third chip layer 16 includes a fifth semiconductor chip 28, a second interconnect chip 30, and a sixth semiconductor chip 32. The first chip layer 12, second chip layer 14, and third chip layer 16 can be bonded to one another and the individual chips can be electrically interconnected to at least one other chip by way of conductive interconnect.

The semiconductor chips can be any of a variety of integrated circuits. A non-exhaustive list of examples includes microprocessors, graphics processing units, application processing units that combines aspects of both, memory devices, an application integrated specific circuit or other.

Each semiconductor chip includes a substrate portion near a back side of the semiconductor chip and an interconnect portion near a front side of the semiconductor chip. The substrate portion includes logic and other circuits and can consist of silicon, germanium, or other types of semiconductor materials, and can include various dielectric materials.

The interconnect portion can include one or more layers of metallization and interlevel dielectric materials providing an interconnect to the semiconductor chip. As described in more detail below, the semiconductor chips may include at least one through silicon via that provides an interconnect between the back side of the semiconductor chip and the front side of the semiconductor chip. The interconnect portion is constructed with a physical device or "PHY" region, which has various internal and external conductor structures dedicated to the transmission of chip-to-chip signals, and a non-PHY region, which has conductor structures that are suitable for the conveyance of power and ground and/or chip-to-circuit board signals.

A semiconductor chip can be connected electrically to an adjacent semiconductor chip in another layer by way of a direct connection between the semiconductor chips, or the semiconductor chip can be connected electrically to another semiconductor chip by way of an interconnect chip. The interconnect chip can be constructed of silicon, germanium or other semiconductor materials and be bulk semiconductor, semiconductor on insulator or other designs. The interconnect chip includes multitudes of internal conductor traces (not visible), which can be on multiple levels or a single level as desired. The traces (not visible) interface electrically with conductor structures of the PHY regions and of the semiconductor chips and by way of conducting pathways. The interconnect portions of the semiconductor chips and the interconnect chip, respectively, can have outermost passivation structures (not visible) that can be a laminate of various insulating materials such as, silicon dioxide, silicon nitride, or other dielectric materials. The interconnects can be composed of various conductor materials, such as copper, aluminum, silver, gold, platinum, palladium or others.

Figure 2:
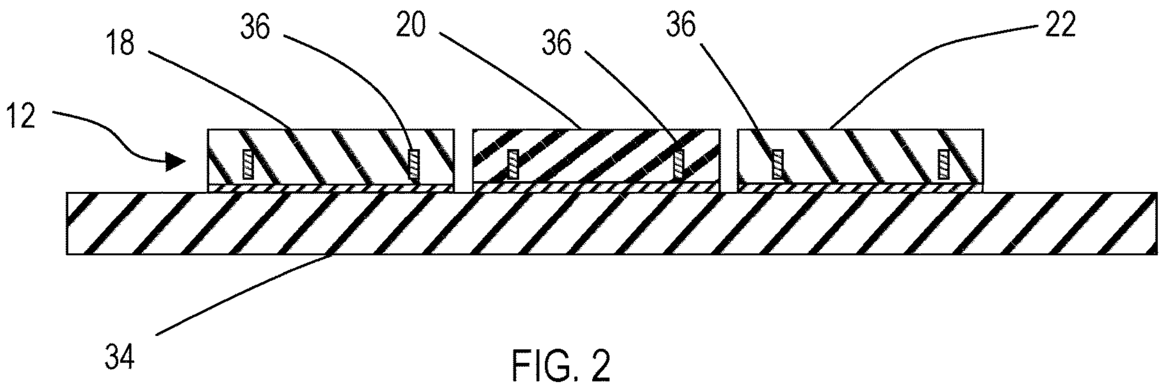
FIG. 2 is a cross-sectional view of a partially assembled example semiconductor device having a first chip layer and a substrate according to some embodiments.

An exemplary process flow for fabricating the semiconductor device 10 can be understood by referring now to FIGS. 2 through 7. FIG. 2 depicts a cross-sectional view depicting the first chip layer 12 including the first semiconductor chip 18, the first interconnect chip 20, and the second semiconductor chip 22 being temporarily bonded to a carrier wafer 34. The carrier wafer 34 can be constructed of glass, silicon or other types of carrier wafer as commonly known in the art. The chips are bonded face down, with the interconnect portion being bonded to the carrier wafer 34 and the substrate portion on an opposing side. As shown in FIG. 2, through silicon vias 36 are present in the first semiconductor chip 18, the second semiconductor chip 22, and the first interconnect chip 20 and provide an electrical pathway from a backside of the first semiconductor chip 18, the second semiconductor chip 22, and the first interconnect chip 20, to the interconnect portion of the respective first semiconductor chip 18, second semiconductor chip 22, and first interconnect chip 20.

Figure 3:
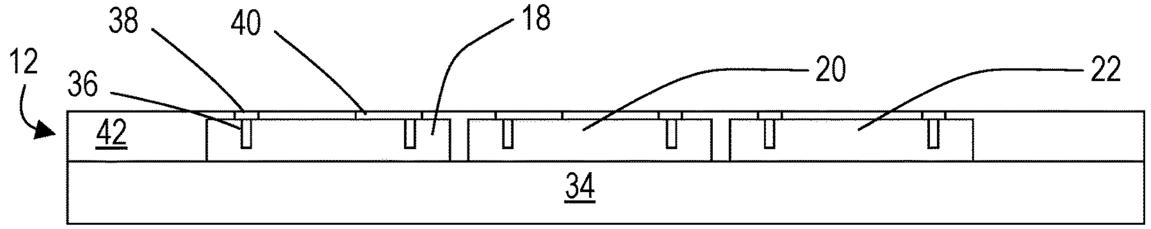
FIG. 3 is a cross-sectional view of the partially assembled example semiconductor device of FIG. 2 with the first chip layer having been thinned according to some embodiments.

FIG. 3 depicts the carrier wafer 34 of FIG. 2 with the chips of the first chip layer 12 being thinned down to expose the through silicon vias 36 and to add interconnects 38 to the through silicon vias 36 as needed. One of skill in the art will recognize that the first semiconductor chip 18, first interconnect chip 20, and second semiconductor chip 22 can be thinned using conventional means such as grinding or other manufacturing process. Likewise, the interconnects 38 can be added using conventional processes with design rule for small spacings associated with the Input/Output mappings of an adjacent chip in the second layer. In addition, in some embodiments a redistribution layer 40 can be added to further distribute electrical connection laterally between chips. FIG. 3 further depicts the semiconductor device 10 with a in a gap fill material 42 partially encapsulating the first semiconductor chip 18, the first interconnect chip 20, and the second semiconductor chip 22. The gap fill material 42 fills the gaps between the first semiconductor chip 18, the first interconnect chip 20, and the second semiconductor chip 22 and can comprise a material suitable for molding and having a melting point lower than the melting points of any of the solder structures present at the time of any the molding processes. In an exemplary arrangement the materials for the gap fill material 42 can have a molding temperature of about 165° C. Two commercially available variants are Sumitomo EME-G750 and G760.

Figure 4:
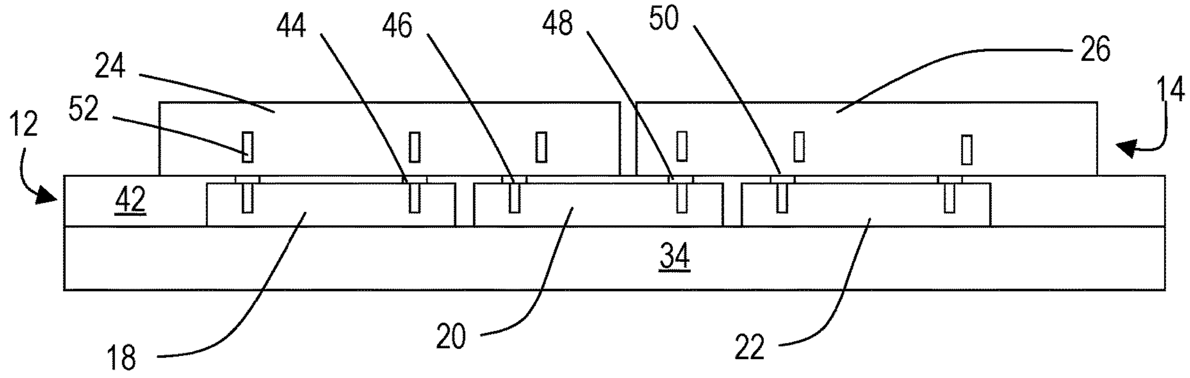
FIG. 4 is a cross-sectional view of the partially assembled example semiconductor device of FIG. 3 with a second chip layer added according to some embodiments.

FIG. 4 depicts the carrier wafer 34 with the second chip layer 14 including the third semiconductor chip 24 and the fourth semiconductor chip 26 being bonded to the back side of the first chip layer 12. The third semiconductor chip 24 and the fourth semiconductor chip 26 can be bonded individually to the first chip layer 12 or bonded as group. The interconnect portion of the third semiconductor chip 24 and the fourth semiconductor chip 26 includes interconnects (not shown) that are electrically coupled to the interconnects 38 and redistribution layer 40 of the first chip layer 12. For example, a first interconnect 44 of the first semiconductor chip 18 can be electrically coupled to a first interconnect of the third semiconductor chip 24, a first interconnect 46 of the first interconnect chip 20 can be electrically coupled to a second interconnect of the third semiconductor chip 24, a second interconnect 48 of the first interconnect chip 20 can be electrically coupled to a first interconnect of the fourth semiconductor chip 26, and a first interconnect 50 of the second semiconductor chip 22 can be electrically coupled to a second interconnect of the fourth semiconductor chip. Additionally, as shown in FIG. 4, the third semiconductor chip 24 and the fourth semiconductor chip 26 each have through silicon vias 52 formed therein. The through silicon vias 52 provide an electrical pathway from a backside of the third semiconductor chip 24 and the fourth semiconductor chip 26 to the interconnect portion of the respective chips.

Figure 5:
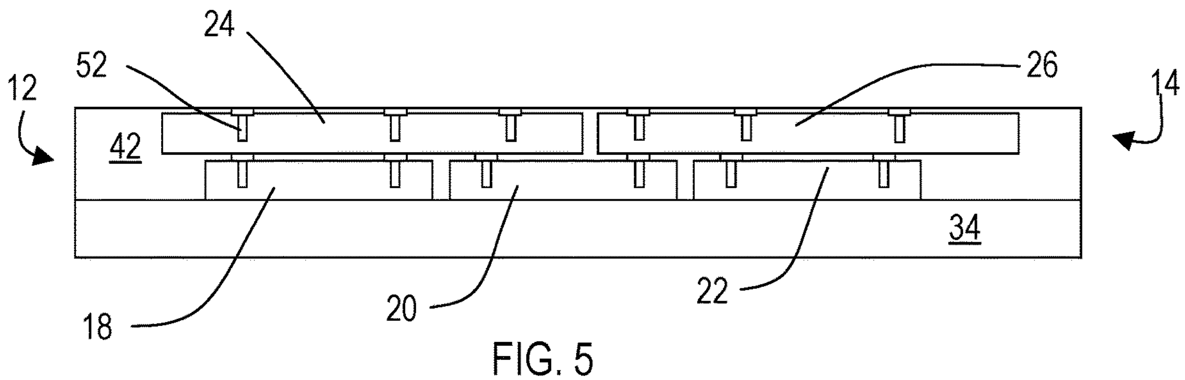
FIG. 5 is a cross-sectional view of the partially assembled example semiconductor device of FIG. 4 with the second chip layer having been thinned according to some embodiments.

FIG. 5 depicts the carrier wafer 34 of FIG. 2 with the second chip layer 14 including third semiconductor chip 24 and the fourth semiconductor chip 26 being thinned down to expose the through silicon vias 52 and to add interconnects 54 to the through silicon vias 52 as needed in a process similar to that described in relation to FIG. 3. Gap fill material 42 is added to further encapsulate the first chip layer 12 and to partially encapsulate the third semiconductor chip 24 and the fourth semiconductor chip 26 of the second chip layer 14.

Figure 6:
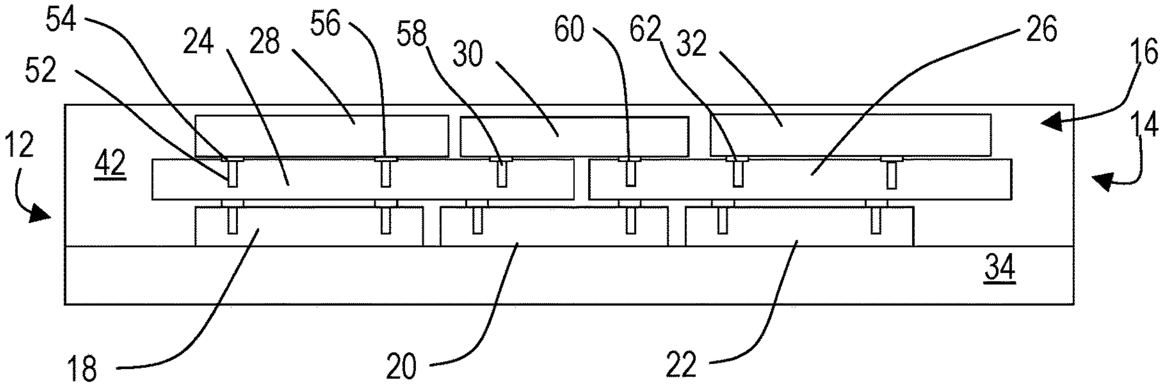
FIG. 6 is a cross-sectional view of the partially assembled example semiconductor device of FIG. 5 with a third chip layer added according to some embodiments.

FIG. 6 depicts the carrier wafer 34 of preceding figures with the third chip layer 16 including the fifth semiconductor chip 28, the sixth semiconductor chip 32, and the second interconnect chip 30 bonded to the back side of the second chip layer 14. Additionally, the gap fill material 42 partially encases the first chip layer 12, the second chip layer 14, and the third chip layer 16. The fifth semiconductor chip 28, second interconnect chip 30, and sixth semiconductor chip 32 can be bonded individually to the second chip layer 14 or bonded as group. The interconnect portion of the fifth semiconductor chip 28, second interconnect chip 30, and sixth semiconductor chip 32 include interconnects (not shown) that are electrically coupled to the interconnects 54 of the second chip layer 14. For example, a third interconnect 56 of the third semiconductor chip 24 can be electrically coupled to a first interconnect of the fifth semiconductor chip 28, a fourth interconnect 58 of the third semiconductor chip 24 can be electrically coupled to a first interconnect of the second interconnect chip 30, a third interconnect 60 of the fourth semiconductor chip 26 can be electrically coupled to a second interconnect of the second interconnect chip 30, and a fourth interconnect 62 of the fourth semiconductor chip 26 can be electrically coupled to a first interconnect of the sixth semiconductor chip 32. While not shown in FIG. 6, the fifth semiconductor chip 28, second interconnect chip 30, and sixth semiconductor chip 32 can each have through silicon vias formed therein allowing further chip layers to be stacked in a similar manner to the second chip layer 14 and the third chip layer 16.

Figure 7:
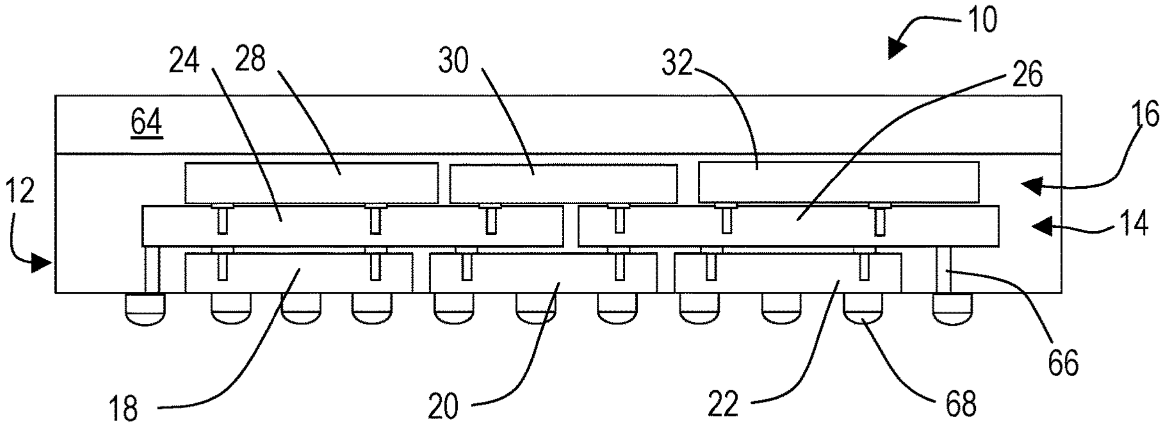
FIG. 7 is a cross-sectional view of a complete example semiconductor device according to some embodiments.

FIG. 7 depicts the completed semiconductor device 10 removed from the carrier wafer 34 revealing the front side of the first chip layer 12. A support wafer 64 is bonded to the back side of the third chip layer 16 to provide support for the semiconductor device 10. In some instances, additional through wafer vias 66 can be added to the gap fill material 42 to enable a direct connection to the second chip layer 14. Additionally, conductor bumps 68 can be added to the front side of the first chip layer 12 to provide for an electrical connection to the various interconnects of the first chip layer 12 when the semiconductor device 10 is mounted to a circuit board.

The semiconductor device 10 facilitates the semiconductor chips communicating to one another in a compact package. Each semiconductor chip is able to communicate with another semiconductor chip by either being directly electrically coupled to the other semiconductor chip by way of the through silicon vias, communicating over one of the interconnect chips, communicate through another semiconductor chip, or use a combination of these techniques. In some examples, the third semiconductor chip 24 and fourth semiconductor chip 26 can be input/output dies for external communication while the first semiconductor chip 18, second semiconductor chip 22, fifth semiconductor chip 28, and sixth semiconductor chip 32 can be core complex dies for performing functionality of the semiconductor device 10.

Figure 8:
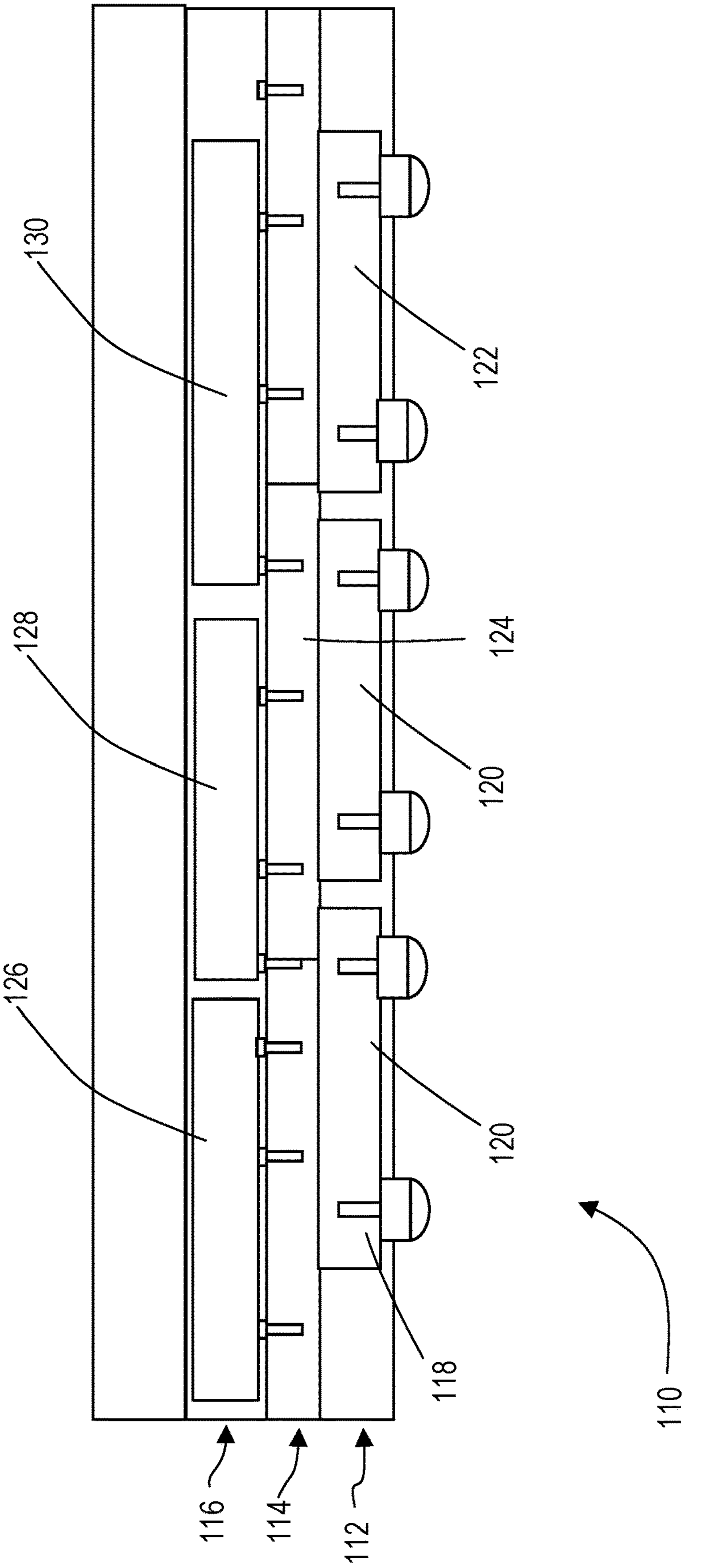
FIG. 8 is a cross-sectional view of an example semiconductor device according to some embodiments according to some embodiments.

FIG. 8 depicts a cross-sectional view of an exemplary semiconductor device 110 that can be mounted to another device such as a circuit board. The semiconductor device 110 includes a first chip layer 112, a second chip layer 114, and a third chip layer 116. The first chip layer 112 has a first semiconductor chip 118, a first interconnect chip 120, and a second semiconductor chip 122. The second chip layer 114 includes a third semiconductor chip 124. The third chip layer 116 includes a fourth semiconductor chip 126, a second interconnect chip 130, and a fifth semiconductor chip 128. The first chip layer 112, second chip layer 114, and third chip layer 116 can be bonded to one another and the individual chips can be electrically interconnected to at least one other chip by way of conductive interconnects. Like the example of FIG. 1, the semiconductor chips can be any of a variety of integrated circuits. In the example of FIG. 8, the third semiconductor chip 124 can be a single wafer that has not been diced. Thus, the third semiconductor chip 124 can have multiple individual circuit assemblies that are electrically separate on the wafer, but physically interconnected by the common wafer. As described in more detail below, the semiconductor chips may include at least one through silicon via that provides an interconnect between the back side of the semiconductor chip and the front side of the semiconductor chip. The interconnect portion is constructed with a physical device or "PHY" region, which has various internal and external conductor structures dedicated to the transmission of chip-to-chip signals, and a non-PHY region, which has conductor structures that are suitable for the conveyance of power and ground and/or chip-to-circuit board signals.

Figure 9:
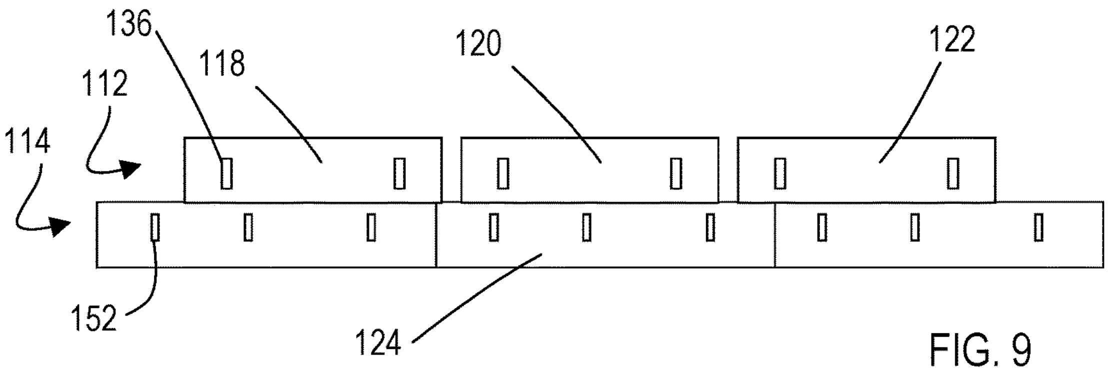
FIG. 9 is a cross-sectional view of a partially assembled example semiconductor device having a first chip layer and a second chip layer according to some embodiments.

An exemplary process flow for fabricating the semiconductor device 110 can be understood by referring now to FIGS. 9 through 13. FIG. 9 depicts a cross-sectional view of the first chip layer 112 including the first semiconductor chip 118, the first interconnect chip 120, and the second semiconductor chip 122, and the second chip layer 114 including the third semiconductor chip 124. The first chip layer 112 and the second chip layer 114 are bonded together in a face to face configuration. Thus, a front side of the first semiconductor chip 118, the first interconnect chip 120, and the second semiconductor chip 122 each face a front side of the third semiconductor chip 124. Because the front side of the semiconductor chips and the interconnect chip each contain an interconnect layer, the various interconnects of the chips may be bonded together directly. For example, a first interconnect of the first semiconductor chip 118 may be electrically coupled to a first interconnect of the third semiconductor chip 124, a first interconnect of the first interconnect chip 120 may be electrically coupled to a second interconnect of the third semiconductor chip 124, a second interconnect of the first interconnect chip 120 may be electrically coupled to a third interconnect of the third semiconductor chip 124, and a first interconnect of the second semiconductor chip 122 may be electrically coupled to a fourth interconnect of the third semiconductor chip 124. In addition to the interconnects at the front side of the chips, each semiconductor chip and interconnect chip can have at least one through silicon via 136, 152 providing access to the interconnect portion of the respective chip from the backside of the respective chip.

Figure 10:
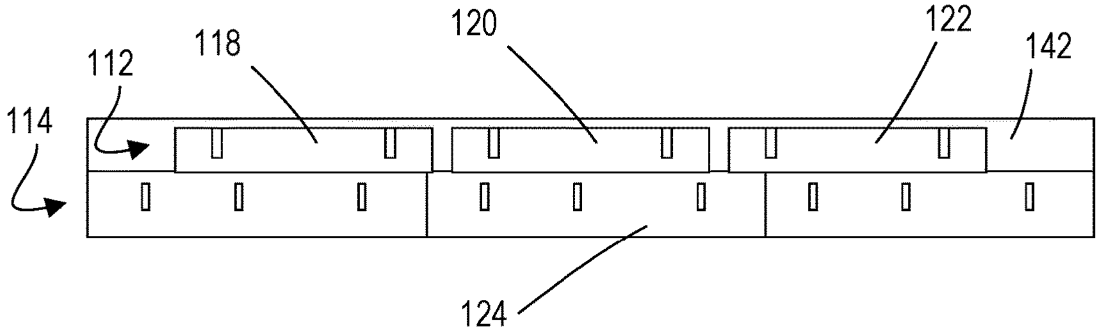
FIG. 10 is a cross-sectional view of the partially assembled example semiconductor device of FIG. 9 with the first chip layer having been thinned according to some embodiments.
Figure 11:
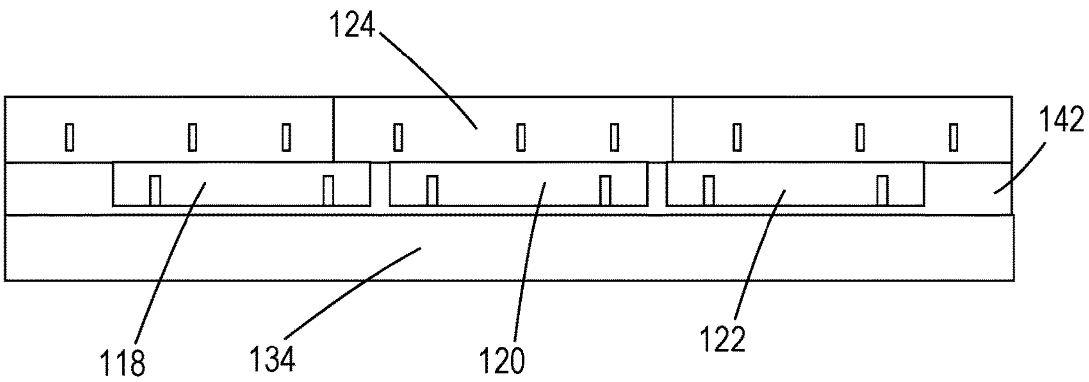
FIG. 11 is a cross-sectional view of the partially assembled example semiconductor device of FIG. 10 bonded to a carrier substrate according to some embodiments.
Figure 12:
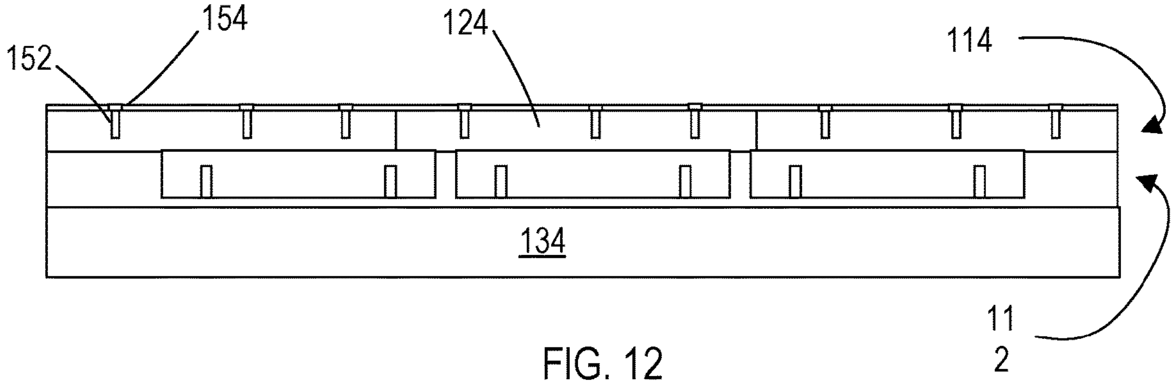
FIG. 12 is a cross-sectional view of the partially assembled example semiconductor device of FIG. 11 with the second chip layer having been thinned according to some embodiments.

FIG. 10 illustrates the first chip layer 112 and second chip layer 114 of FIG. 9 with the chips of the first chip layer 112 having been thinned and a gap fill material 142 added to support the chips. FIG. 11 illustrates the thinned first chip layer 112 and second chip layer 114 of FIG. 10 flipped over such that the second chip layer 114 is on top of the first chip layer 112. The first chip layer 112 is bonded to a carrier wafer 134. FIG. 12 shows the first chip layer 112, second chip layer 114, and the carrier wafer 134 of FIG. 11 with the third semiconductor chip 124 of the second chip layer 114 having been thinned to reveal the through silicon vias 152. The through silicon vias 152 can have additional interconnects 154 such as capture pads added at this time to facilitate assembly and electrical communication with other semiconductor devices.

Figure 13:
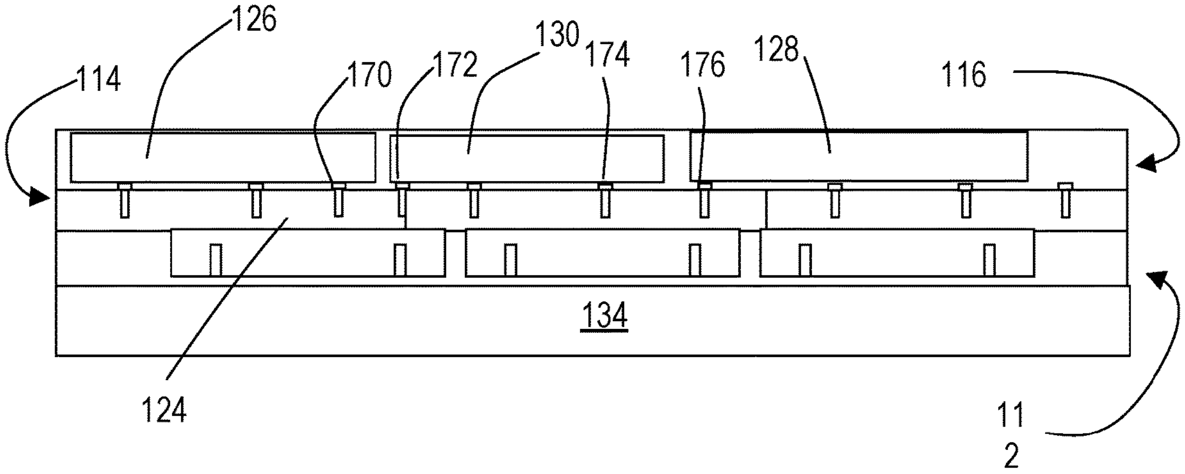
FIG. 13 is a cross-sectional view of the partially assembled example semiconductor device of FIG. 12 with a third chip layer added according to some embodiments.

In FIG. 13, the third chip layer 116 including a fourth semiconductor chip 126, a second interconnect chip 130, and a fifth semiconductor chip 128 is shown bonded to the back side of the second chip layer 114 interconnecting the interconnects 154 of the third semiconductor chip 124 with interconnects of the fourth semiconductor chip 126, the second interconnect chip 130, and the fifth semiconductor chip 128. For example, a fifth interconnect 170 of the third semiconductor chip 124 may be electrically coupled with a first interconnect of the fourth semiconductor chip 126, a sixth interconnect 172 of the third semiconductor chip 124 may be electrically coupled with a first interconnect of the second interconnect chip 130, a seventh interconnect 174 of the third semiconductor chip 124 may be electrically coupled with a second interconnect of the second interconnect chip 130, and an eighth interconnect 176 of the third semiconductor chip 124 may be electrically coupled with a first interconnect of the fifth semiconductor chip 128. Thus, as shown in FIG. 11, the chip layers are generally arranged in a front to front to back configuration, with the front side of the chips of the first chip layer 112 facing the front side of the chips of the second chip layer 114 and the back side of the chips of the second chip layer 114 facing the frontside of the chips of the third chip layer 116. In addition, the third chip layer 116 is shown encapsulated in a gap fill material.

Figure 14:
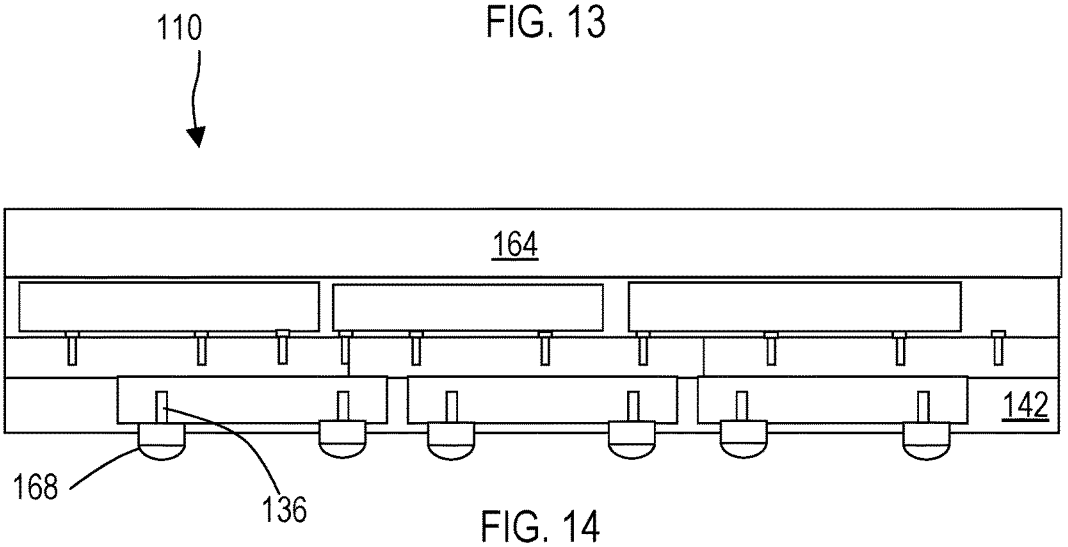
FIG. 14 is a cross-sectional view of a completed example semiconductor device according to some embodiments.

FIG. 14 illustrates the completed semiconductor device 110. In FIG. 14, the carrier substrate is removed to expose the back side of the first chip layer 112. Additionally, a support wafer 164 is bonded to the back side of the third chip layer 116. In some instances, additional through wafer vias (not shown) can be added to the gap fill material 142 to enable a direct connection to the second chip layer 114. Additionally, conductor bumps 168 can be added to the front side of the first chip layer 112 to provide for an electrical connection to the various interconnects of the first chip layer 112 when the semiconductor device 110 is mounted to a circuit board.

Figure 15:
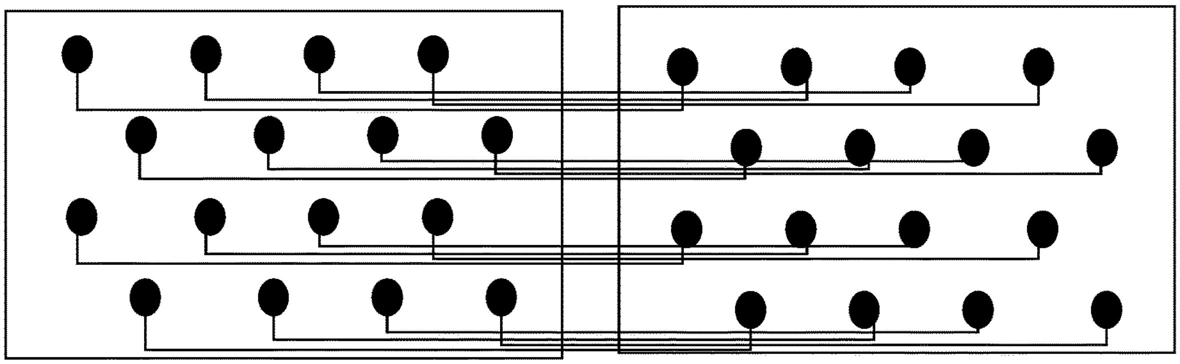
FIG. 15 is a top view of interconnects of an example semiconductor chip with single sided interconnects according to some embodiments.
Figure 16:
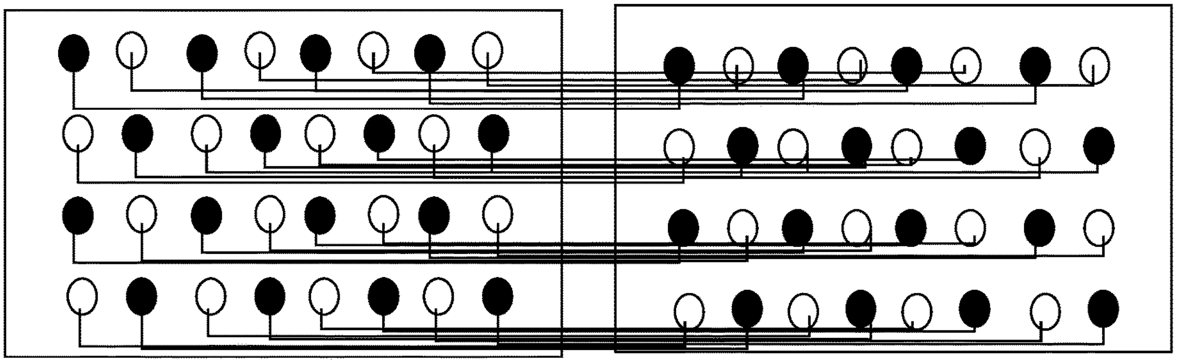
FIG. 16 is a top view of interconnects of an example semiconductor chip with double sided interconnects according to some embodiments.

FIGS. 15 and 16 illustrate a comparison of the density of interconnects between a semiconductor chip having interconnects on a single side (e.g., FIG. 12) and a semiconductor chip having interconnects on two sides (e.g., FIG. 13). In FIGS. 12 and 13, the solid circles represent interconnects on a side of a chip facing the viewer, while the unfilled circles represent interconnects on an opposing side of the chip. Thus, as shown in FIG. 13, the number of interconnects can be doubled in number without affecting the density of interconnects.

Figure 17:
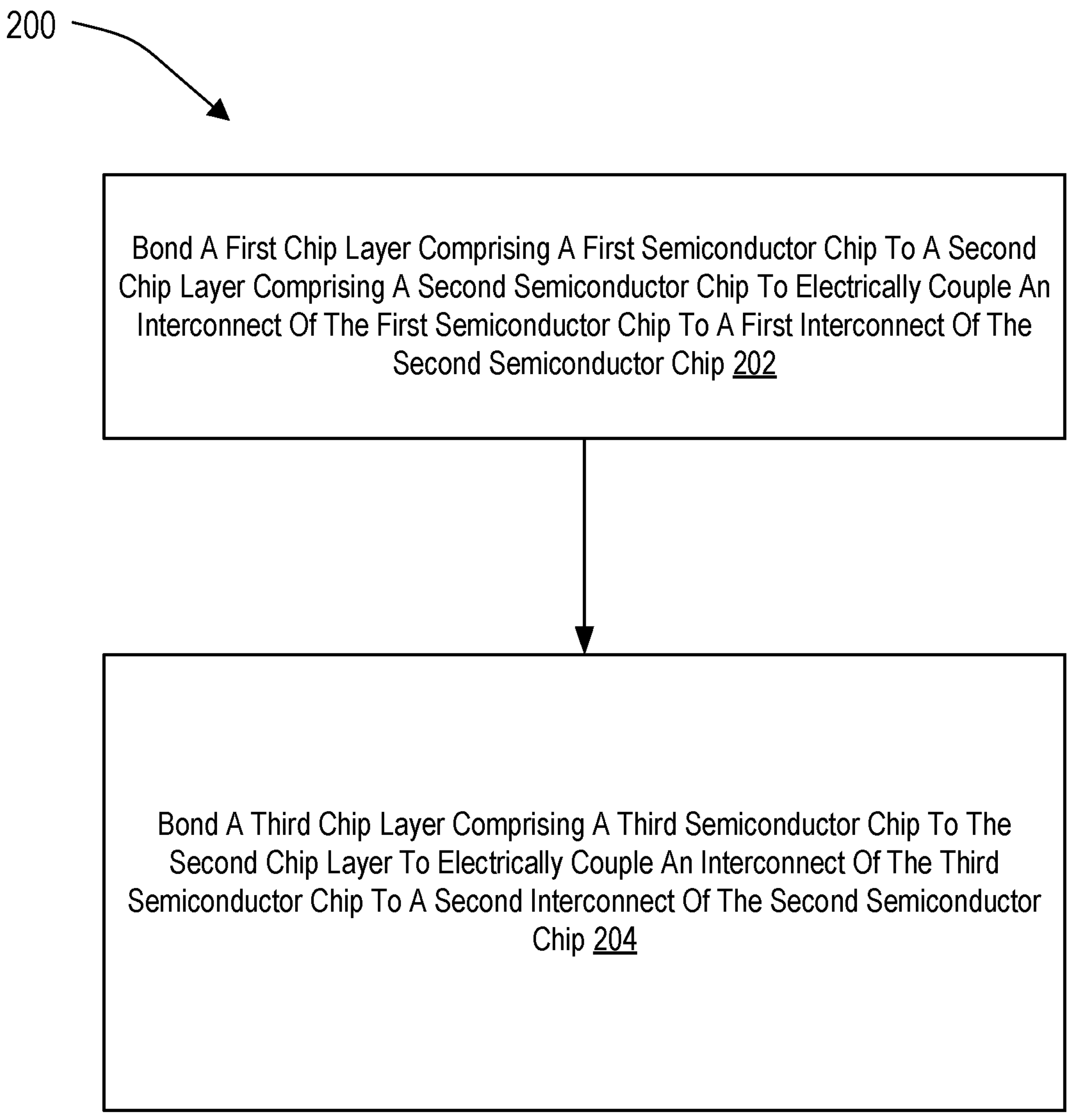
FIG. 17 is a flow chart of an example method for manufacturing a semiconductor device according to some embodiments.

FIG. 17 is a flowchart of a method 200 for manufacturing a semiconductor device. In the method a first chip is bonded 202 to a second chip layer. The first chip layer includes a first semiconductor chip, and the second chip layer includes a second semiconductor chip. The bonding electrically couples an interconnect of the first semiconductor chip to a first interconnect of the second semiconductor chip. For example, with reference to FIG. 4 the first chip layer 12 including first semiconductor chip 18 can be bonded to the second chip layer 14 including third semiconductor chip 24. The interconnects of the first semiconductor chip 18 and the third semiconductor chip 24 can be electrically coupled as described previously. In another example, with reference to FIG. 9, the first chip layer 112 including first semiconductor chip 118 can be bonded to the second chip layer 114 including third semiconductor chip 124. The interconnects of the first semiconductor chip 118 and the third semiconductor chip 124 can be electrically coupled as described previously.

A third chip layer is then bonded 204 to the second chip layer. The third chip layer includes a third semiconductor chip. The bonding electrically couples an interconnect of the third semiconductor chip to a second interconnect of the second semiconductor chip. For example, with reference to FIG. 6, the third chip layer 16 including fifth semiconductor chip 28 can be bonded to the second chip layer 14 including third semiconductor chip 24 to electrically couple interconnects of the fifth semiconductor chip 28 and the third semiconductor chip 24. In another example, with reference to FIG. 13, the third chip layer 116 including the fourth semiconductor chip 126 can be bonded to the second chip layer 114 including the third semiconductor chip 124 to electrically couple interconnects of the fourth semiconductor chip and the third semiconductor chip 124.

Figure 18:
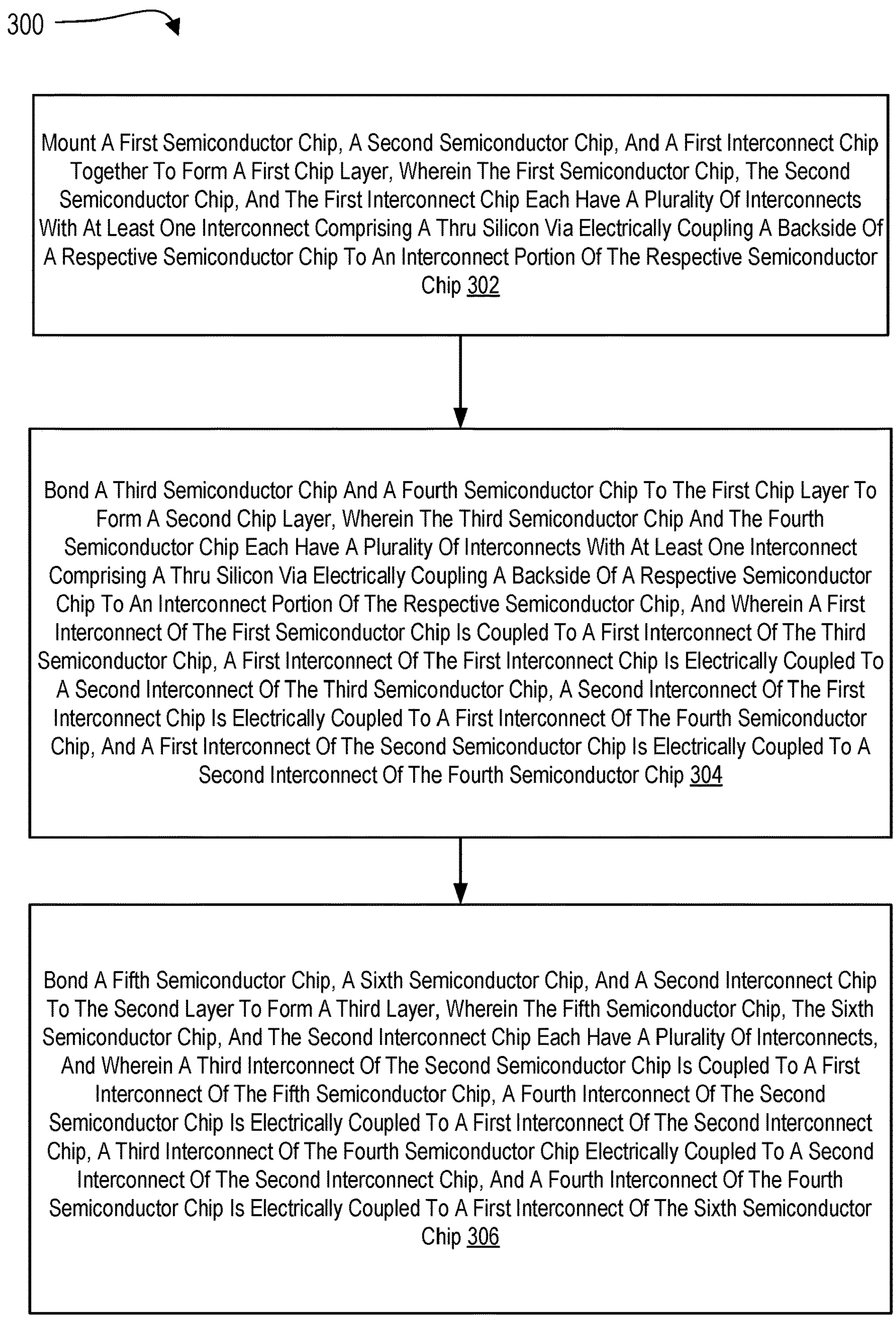
FIG. 18 is a flow chart of an example method for manufacturing a semiconductor device according to some embodiments.

FIG. 18 is a flowchart of a method 300 for manufacturing a semiconductor device. In the method, a first semiconductor chip, a second semiconductor chip, and a first interconnect chip are mounted 302 together to form a first chip layer. The first semiconductor chip, the second semiconductor chip, and the first interconnect chip each have a plurality of interconnects with at least one interconnect including a thru silicon via electrically coupling a backside of a respective semiconductor chip to an interconnect portion of the respective semiconductor chip. For example, referring to FIG. 2, the method can include mounting the first semiconductor chip 18, the first interconnect chip 20, and the second semiconductor chip 22 together by bonding them to a common carrier wafer 34.

The method further includes bonding 304 a third semiconductor chip and a fourth semiconductor chip to the first chip layer to form a second chip layer. The third semiconductor chip and the fourth semiconductor chip each have a plurality of interconnects with at least one interconnect including a thru silicon via electrically coupling a backside of a respective semiconductor chip to an interconnect portion of the respective semiconductor chip. A first interconnect of the first semiconductor chip is coupled to a first interconnect of the third semiconductor chip, a first interconnect of the first interconnect chip is electrically coupled to a second interconnect of the third semiconductor chip, a second interconnect of the first interconnect chip is electrically coupled to a first interconnect of the fourth semiconductor chip, and a first interconnect of the second semiconductor chip is electrically coupled to a second interconnect of the fourth semiconductor chip. For example, referring to FIG. 4, the third semiconductor chip 24 and the fourth semiconductor chip 26 can be bonded to the first chip layer 12 and the interconnects of the various chips interconnected as described previously.

The method further includes bonding 306 a fifth semiconductor chip, a sixth semiconductor chip, and a second interconnect chip to the second layer to form a third layer. The fifth semiconductor chip, the sixth semiconductor chip, and the second interconnect chip each have a plurality of interconnects. A third interconnect of the second semiconductor chip is coupled to a first interconnect of the fifth semiconductor chip, a fourth interconnect of the second semiconductor chip is electrically coupled to a first interconnect of the second interconnect chip, a third interconnect of the fourth semiconductor chip electrically coupled to a second interconnect of the second interconnect chip, and a fourth interconnect of the fourth semiconductor chip is electrically coupled to a first interconnect of the sixth semiconductor chip. For example, referring to FIG. 6, the fifth semiconductor chip 28, the sixth semiconductor chip 32, and the second interconnect chip 30 can be bonded to the second chip layer 14 and the interconnects of the various chips interconnected as described previously.

The flowchart and block diagrams in the Figures illustrate the architecture, functionality, and operation of possible implementations of systems and methods according to various embodiments of the present disclosure. In some alternative implementations, the functions noted in the block can occur out of the order noted in the Figures. For example, two blocks shown in succession can, in fact, be executed substantially concurrently, or the blocks can sometimes be executed in the reverse order, depending upon the functionality involved.

It will be understood from the foregoing description that modifications and changes can be made in various embodiments of the present disclosure. The descriptions in this specification are for purposes of illustration only and are not to be construed in a limiting sense. The scope of the present disclosure is limited only by the language of the following claims.

What is claimed is:

1. A method of manufacturing a semiconductor device, comprising:

bonding a first semiconductor chip to a second semiconductor chip, the first semiconductor chip being stacked on the second semiconductor chip;

bonding a third semiconductor chip to the second semiconductor chip, the second semiconductor chip being stacked on the third semiconductor chip, wherein the first semiconductor chip, the second semiconductor chip, and the third semiconductor chip are arranged such that a back side of the first semiconductor chip faces a front side of the second semiconductor chip, and a back side of the second semiconductor chip faces a front side of the third semiconductor chip;

wherein at least one interconnect of the second semiconductor chip comprises a first through silicon via electrically coupling the back side of the second semiconductor chip to the front side of the second semiconductor chip, and wherein the first through silicon via extends to the back side of the second semiconductor chip to be coplanar with a back side surface of the second semiconductor chip and is not coplanar with a front side surface of the second semiconductor chip; and wherein at least one interconnect of the first semiconductor chip comprises a second through silicon via electrically coupling the back side of the first semiconductor chip to the front side of the first semiconductor chip, and wherein the second through silicon via extends to the back side of the first semiconductor chip to be coplanar with a back side surface of the first semiconductor chip and is not coplanar with a front side surface of the first semiconductor chip.

2. The method of claim 1, wherein:

bonding the first semiconductor chip to the second semiconductor chip electrically couples an interconnect of the first semiconductor chip to a first interconnect of the second semiconductor chip;

bonding the third semiconductor chip to the second semiconductor chip electrically couples an interconnect of the third semiconductor chip to a second interconnect of the second semiconductor chip;

an interconnect chip is laterally adjacent to the first semiconductor chip; and bonding the first semiconductor chip to the second semiconductor chip also electrically couples a first interconnect of the interconnect chip to a third interconnect of the second semiconductor chip and a second interconnect of the interconnect chip to a first interconnect of a fourth semiconductor chip.

3. The method of claim 2, wherein a second interconnect chip is laterally adjacent to the third semiconductor chip, wherein the interconnect chip and the second interconnect chip each include internal conductor traces for routing communications between semiconductor chips, and wherein bonding the third semiconductor chip to the second semiconductor chip electrically couples a first interconnect of the second interconnect chip to a fourth interconnect of the second semiconductor chip and a second interconnect of the second interconnect chip to a second interconnect of the fourth semiconductor chip.

4. The method of claim 1, wherein:

bonding the first semiconductor chip to the second semiconductor chip electrically couples an interconnect of the first semiconductor chip to a first interconnect of the second semiconductor chip;

bonding the third semiconductor chip to the second semiconductor chip electrically couples an interconnect of the third semiconductor chip to a second interconnect of the second semiconductor chip; and the method further comprises electrically coupling the interconnect of the first semiconductor chip and the first interconnect of the second semiconductor chip by way of a redistribution layer.

5. A semiconductor device comprising:

a first chip layer comprising a first semiconductor chip having a plurality of interconnects;

a second chip layer comprising a second semiconductor chip having a plurality of interconnects;

a third chip layer comprising a third semiconductor chip having a plurality of interconnects, wherein the first semiconductor chip is stacked on the second semiconductor chip, wherein the second chip layer is stacked on the third chip layer, and wherein the first chip layer, the second chip layer, and the third chip layer are arranged such that a back side of the first semiconductor chip faces a front side of the second semiconductor chip, and a back side of the second semiconductor chip faces a front side of the third semiconductor chip;

wherein at least one interconnect of the second semiconductor chip comprises a first through silicon via electrically coupling the back side of the second semiconductor chip to the front side of the second semiconductor chip, and wherein the first through silicon via extends to the back side of the second semiconductor chip to be coplanar with a back side surface of the second semiconductor chip and is not coplanar with a front side surface of the second semiconductor chip; and wherein at least one interconnect of the first semiconductor chip comprises a second through silicon via electrically coupling the back side of the first semiconductor chip to the front side of the first semiconductor chip, and wherein the second through silicon via extends to the back side of the first semiconductor chip to be coplanar with a back side surface of the first semiconductor chip and is not coplanar with a front side surface of the first semiconductor chip.

6. The semiconductor device of claim 5, wherein:

a first interconnect of the first semiconductor chip is electrically coupled to a first interconnect of the second semiconductor chip;

a first interconnect of the third semiconductor chip is electrically coupled to a second interconnect of the second semiconductor chip; and the first chip layer further comprises an interconnect chip laterally adjacent to the first semiconductor chip and having a plurality of interconnects, the second chip layer further comprises a fourth semiconductor chip having a plurality of interconnects, and a first interconnect of the interconnect chip is electrically coupled to a third interconnect of the second semiconductor chip and a second interconnect of the interconnect chip is electrically coupled to a first interconnect of the fourth semiconductor chip.

7. The semiconductor device of claim 6, wherein the third chip layer further comprises a second interconnect chip laterally adjacent to the third semiconductor chip and having a plurality of interconnects, wherein the interconnect chip and the second interconnect chip each include internal conductor traces for routing communications between semiconductor chips, and wherein a first interconnect of the second interconnect chip is electrically coupled to a fourth interconnect of the second semiconductor chip and a second interconnect of the second interconnect chip is electrically coupled to a second interconnect of the fourth semiconductor chip.

8. The semiconductor device of claim 5, wherein:

a first interconnect of the first semiconductor chip is electrically coupled to a first interconnect of the second semiconductor chip;

a first interconnect of the third semiconductor chip is electrically coupled to a second interconnect of the second semiconductor chip; and the semiconductor device further comprises a redistribution layer electrically coupling the first interconnect of the first semiconductor chip and the first interconnect of the second semiconductor chip.

9. A method of manufacturing a semiconductor device, comprising:

mounting a first semiconductor chip, a second semiconductor chip, and a first interconnect chip together to form a first chip layer, wherein the first semiconductor chip, the second semiconductor chip, and the first interconnect chip each have a plurality of interconnects with at least one interconnect comprising a thru silicon via electrically coupling a substrate portion of a respective semiconductor chip to an interconnect portion of the respective semiconductor chip;

bonding a third semiconductor chip and a fourth semiconductor chip to the first chip layer to form a second chip layer, wherein the third semiconductor chip and the fourth semiconductor chip each have a plurality of interconnects with at least one interconnect comprising a thru silicon via electrically coupling a substrate portion of a respective semiconductor chip to an interconnect portion of the respective semiconductor chip, wherein a first interconnect of the first semiconductor chip is coupled to a first interconnect of the third semiconductor chip, and a first interconnect of the first interconnect chip is electrically coupled to a second interconnect of the third semiconductor chip, and wherein a second interconnect of the first interconnect chip is electrically coupled to a first interconnect of the fourth semiconductor chip, and a first interconnect of the second semiconductor chip is electrically coupled to a second interconnect of the fourth semiconductor chip; and bonding a fifth semiconductor chip, a sixth semiconductor chip, and a second interconnect chip to the second chip layer to form a third chip layer, wherein the fifth semiconductor chip, the sixth semiconductor chip, and the second interconnect chip each have a plurality of interconnects, wherein a third interconnect of the second semiconductor chip is coupled to a first interconnect of the fifth semiconductor chip, and a fourth interconnect of the second semiconductor chip is electrically coupled to a first interconnect of the second interconnect chip, and wherein a third interconnect of the fourth semiconductor chip is electrically coupled to a second interconnect of the second interconnect chip, and a fourth interconnect of the fourth semiconductor chip is electrically coupled to a first interconnect of the sixth semiconductor chip.

10. The method of claim 9, wherein the first chip layer is bonded to a carrier, and wherein the method further comprises bonding a support wafer to the third chip layer and removing the carrier.

11. The method of claim 9, wherein the method further comprises filling gaps between the first semiconductor chip, the second semiconductor chip, the third semiconductor chip, the fourth semiconductor chip, and the fifth semiconductor chip with a gap fill material.

12. The method of claim 9, further comprises forming a plurality of through die vias providing access to the second chip layer.

13. The method of claim 9, further comprising bonding a substrate portion of the first chip layer to a carrier and bonding a support wafer to the third chip layer.

14. The method of claim 9, further comprising including a redistribution layer between the first chip layer and the second chip layer.

15. The method of claim 1, wherein the front side includes one or more layers of metallization and interlevel dielectric materials.

16. The method of claim 1, wherein the front side includes:

a physical device region having conductive structures for transmission of chip-to-chip signals; and a non-physical device region having conductive structures for transmission of one or more of power signals, ground signals, or chip-to-circuit board signals.

17. The semiconductor device of claim 5, wherein the front side includes one or more layers of metallization and interlevel dielectric materials.

18. The semiconductor device of claim 8, wherein the front side includes:

a physical device region having conductive structures for transmission of chip-to- chip signals; and a non-physical device region having conductive structures for transmission of one or more of power signals, ground signals, or chip-to-circuit board signals.

19. The method of claim 3, wherein a fifth semiconductor chip is laterally adjacent to the interconnect chip, and wherein bonding the first semiconductor chip to the second semiconductor chip also electrically couples a first interconnect of the fifth semiconductor chip to a third interconnect of the fourth semiconductor chip.

20. The method of claim 19, wherein a sixth semiconductor chip is laterally adjacent to the second interconnect chip, and wherein bonding the third semiconductor chip to the second semiconductor chip electrically couples a first interconnect of the sixth semiconductor chip to a fourth interconnect of the fourth semiconductor chip.

* * * * *